(12) United States Patent
Baron et al.

(10) Patent No.: US 9,293,322 B2
(45) Date of Patent: Mar. 22, 2016

(54) OPTIMIZED METHOD FOR FABRICATING PATTERNS OF III-V SEMICONDUCTOR MATERIAL ON A SEMICONDUCTOR SUBSTRATE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Thierry Baron, Saint-Egreve (FR); Franck Bassani, Echirolles (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 14/483,544

(22) Filed: Sep. 11, 2014

(65) Prior Publication Data

US 2015/0079766 A1 Mar. 19, 2015

(30) Foreign Application Priority Data

Sep. 13, 2013 (FR) ...................................... 13 58813

(51) Int. Cl.
*H01L 21/02* (2006.01)
*C23C 16/02* (2006.01)
(Continued)

(52) U.S. Cl.
CPC ...... *H01L 21/02494* (2013.01); *C23C 16/0272* (2013.01); *C23C 16/045* (2013.01);
(Continued)

(58) Field of Classification Search
CPC ................... H01L 21/02494; H01L 21/02381; H01L 21/02538; H01L 21/02546; H01L 21/0262; H01L 21/02647; H01L 21/02488; H01L 21/02463; C23C 16/0272; C23C 16/045
See application file for complete search history.

(56) References Cited

U.S. PATENT DOCUMENTS

2011/0049568 A1 3/2011 Lochtefeld et al.

FOREIGN PATENT DOCUMENTS

WO 2008030574 A1 3/2008
WO 2008051503 A2 5/2008

OTHER PUBLICATIONS

T.A. Langdo, et al., "High Quality Ge on Si by Epitaxial Necking", Applied Physics Letters, Jun. 19, 2000, pp. 3700-3703, vol. 76, No. 25, American Institute of Physics.
(Continued)

*Primary Examiner* — Long Pham
(74) *Attorney, Agent, or Firm* — Baker & Hostetler LLP

(57) ABSTRACT

A method for fabricating patterns of III-V semiconductor material on a semiconductor substrate based on oriented silicon or germanium comprises: production of a growth mask on the surface of the substrate, defining masking patterns $Mi_{ox}$ of width L, of height $h_{ox}$ with a distance S between masking patterns; growth of patterns $Mi_{III-V}$ of III-V material between said masking patterns, such that said patterns exhibit a height h relative to the top plane of said masking patterns, said height h being at or above a critical minimum height $h_c$, the growth step comprising: determining growth rates $v_{100}$ and $v_{110}$ at right angles to the face of the III-V material, defining ratio $R=v_{100}/v_{110}$; determining the angle of dislocations θ of the III-V material relative to the plane of the substrate; determining the critical minimum height $h_c$ by the equation:

$$h_c = \frac{h_{ox} - S \times \tan(\theta)}{\frac{\tan(\theta)}{R} - 1}$$

with R being determined to be greater than $\tan(\theta)$.

17 Claims, 4 Drawing Sheets

(51) Int. Cl.
*C23C 16/04* (2006.01)
*C23C 16/30* (2006.01)

(52) U.S. Cl.
CPC ........ *C23C16/301* (2013.01); *H01L 21/02381* (2013.01); *H01L 21/02463* (2013.01); *H01L 21/02488* (2013.01); *H01L 21/02538* (2013.01); *H01L 21/02546* (2013.01); *H01L 21/02639* (2013.01); *H01L 21/02647* (2013.01); *H01L 21/0262* (2013.01); *H01L 21/02433* (2013.01)

(56) References Cited

OTHER PUBLICATIONS

Z. R. Zytkiewicz, "Epitaxial Lateral Overgrowth of GaAs: Principle and Growth Mechanism", Cryst. Res. Technol., 1999, vol. 34, pp. 573 thru 582.

J. S. Park et al., "Defect Reduction of Selective Ge Epitaxy in Trenches on Si(001) Substrates Using Aspect Ratio Trapping", Applied Physics Letters, 2007, vol. 90, pp., 52113 thru 52113-3.

OPTIMIZED METHOD FOR FABRICATING PATTERNS OF III-V SEMICONDUCTOR MATERIAL ON A SEMICONDUCTOR SUBSTRATE

CROSS-REFERENCE TO RELATED APPLICATION

This application claims priority to foreign French patent application No. FR 1358813, filed on Sep. 13, 2013, the disclosure of which is incorporated by reference in its entirety.

FIELD OF THE INVENTION

The invention relates to the field of the epitaxy of III-V semiconductor materials on silicon and/or germanium substrate for applications in the field of microelectronics, photonics, optoelectronics and photovoltaics.

BACKGROUND

In these different fields, an issue of prime importance is growing III-V semiconductor materials, that can be based on arsenic and/or phosphorous, with a very good structural quality (few defects of dislocation, twin, antiphase wall type).

These materials take on great interest for different applications such as, notably: field effect and high mobility transistors, emitters, detectors, modulators for photonics, components for photovoltaic devices or even terahertz components.

The creation of III-V semiconductor materials on Si substrate has been studied for many years and the difficulties linked to the growth are now clearly identified. In effect, they are due to the difference in crystalline structure, the great difference in mesh parameters and the difference in heat expansion coefficient between the layer and the substrate, the III-V layers on Si possibly containing numerous structural defects such as antiphase walls, extended dislocations, even cracks.

Two solutions, or a combination of these two solutions, have notably been proposed in the literature in order to obtain a layer of good crystalline quality on the surface in the case of a layer to be epitaxiated exhibiting a great difference in mesh parameter with its substrate. The first solution known as epitaxial lateral overgrowth, as described in the article by Zytkiewicz Z. "Epitaxial lateral overgrowth of semiconductors", in: Dhanaraj G, Byrappa K, Prasad V, Dudley M, editors. Handbook of crystal growth, Heidelberg: Springer Verlag: 2010, p. 999-1039, (ELO), the diagram of which is given in FIG. 1, consists in growing, on a substrate, a first layer which exhibits a strong density of dislocations and then in continuing the growth through a mask, by lateral epitaxy, to obtain a top layer.

The second solution, as represented in FIG. 2, consists in trapping the emergent dislocations against the lateral walls of patterns of oxide, according to J.-S. Park, J. Bai, M. Curtin, B. Adekore, M. Carroll, A. Lochtefeld, Appl. Phys. Lett. 90, 052113 (2007) (Amberwave), if the aspect ratio of these patterns is well chosen. The growth is done by selective epitaxy and the dislocations are then blocked against the walls of oxide.

SUMMARY OF THE INVENTION

In this context, the subject of the present invention is a fabricating method comprising the determination of parameters that are optimized in such a way as to grow III-V materials, with emergent dislocations trapped and thus create layers of good crystalline quality exhibiting a low density of dislocations.

More specifically, the subject of the invention is a method for fabricating patterns of III-V semiconductor material on a semiconductor substrate based on oriented silicon (100) or on oriented germanium (100), characterized in that it comprises the following steps:

the production of a growth mask on the surface of said substrate, defining masking patterns $Mi_{ox}$ of length L, of height $h_{ox}$ with a distance S between masking patterns;

a step of growth of patterns $Mi_{III-V}$ of III-V material between said masking patterns, such that said patterns exhibit a height h relative to the top plane of said masking patterns, said height h being greater than or equal to a critical minimum height $h_c$, said growth step comprising:

determining the rate of growth $v_{100}$ in a direction at right angles to the face (100) of said III-V material, and determining the rate of growth $v_{110}$ in a direction at right angles to the face (110) of said III-V material, defining a ratio $R=v_{100}/v_{110}$;

determining the angle of the dislocations $\theta$ of said III-V material relative to the plane of said substrate (100);

determining said critical minimum height $h_c$ defined by the equation:

$$h_c = \frac{h_{ox} - S \times \tan(\theta)}{\frac{\tan(\theta)}{R} - 1}$$

and R being determined to be strictly greater than tan($\theta$).

The III-V material can typically be gallium arsenide GaAs or indium arsenide InAs.

According to a variant of the invention, the method comprises a step of nucleation of III-V material between said masking patterns on the surface of said substrate.

According to an advantageous variant of the invention, the ratio R is greater than 5.

According to a variant, the steps of nucleation and of growth of the patterns are performed in similar temperature and pressure conditions.

According to a variant of the invention, said height h also satisfies the condition:

$$L > \frac{2}{R} \times h,$$

such that said patterns $Mi_{III-V}$ of III-V material do not coalesce.

According to a variant of the invention, the masking patterns and the patterns of III-V material are linear patterns.

According to a variant of the invention, the method comprises the production of top patterns $Mj_{III-V}$ of III-V material, on the surface of said patterns $Mi_{III-V}$ of III-V semiconductor material.

According to a variant of the invention, the substrate being of silicon, the III-V material is gallium arsenide.

According to a variant of the invention, the angle of the dislocations is 54.7°.

According to a variant of the invention, the growth mask is produced by oxidation of said substrate and then etching.

According to a variant of the invention, the growth mask is obtained by the production of a layer of material exhibiting a selectivity to etching relative to the silicon or to the germanium, followed by an operation of local etching of said layer.

According to a variant of the invention, the layer of material exhibiting a selectivity to etching relative to the silicon or to the germanium is made of silicon nitride.

According to a variant of the invention, the distance between masking patterns can lie between approximately a few tens of nanometres and a few hundreds of nanometres.

According to a variant of the invention, the width of the masking patterns is greater than several tens of nanometres.

According to a variant of the invention, the step nucleation between said masking patterns, allowing the growth of said III-V material, being performed at a so-called nucleation temperature, the step of growth of the patterns $Mi_{III\text{-}V}$ being performed at a so-called growth temperature, said growth temperature is greater than said nucleation temperature.

According to a variant of the invention, said nucleation temperature lies between approximately 300° C. and 450° C., said growth temperature lying between approximately 350° C. and 650° C.

According to a variant of the invention, the method further comprises a step of selective epitaxy of Si or Ge material at the bottom of a cavity produced after the operation of producing the masking patterns and before the operation of growth of the patterns $Mi_{III\text{-}V}$, making it possible to improve the physical properties of the III-V materials.

BRIEF DESCRIPTION OF THE DRAWINGS

The invention will be better understood, and other advantages will become apparent, on reading the following description given as a nonlimiting example, and using the attached figures in which.

DETAILED DESCRIPTION

Figure 1:
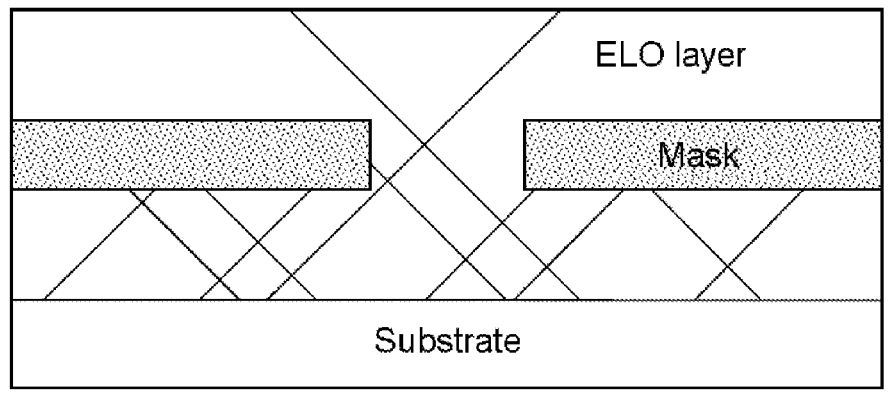
FIG. 1 illustrates a first exemplary method for growing III-V material on silicon substrate (100) according to the prior art.
Figure 2:
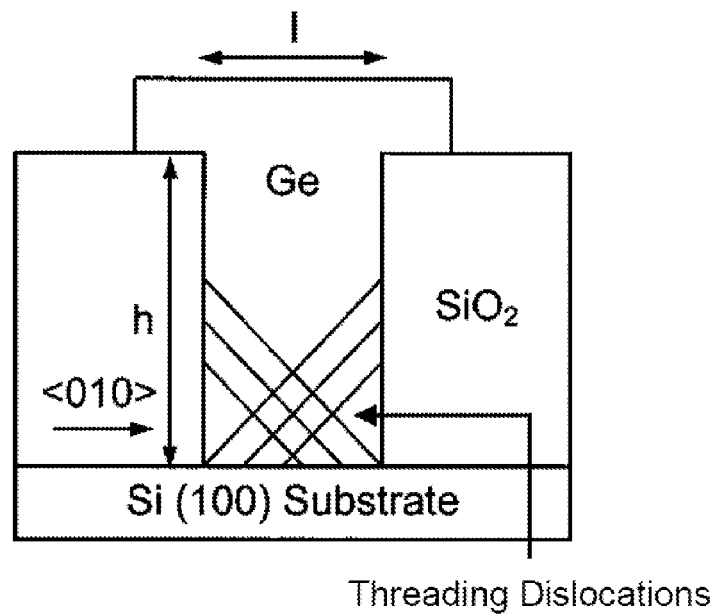
FIG. 2 illustrates a second exemplary method for growing III-V material on silicon substrate (100) according to the prior art.

To produce linear patterns or patterns of any other geometry, of III-V material on the surface of a silicon or germanium substrate, the method of the present invention comprises the production of a growth mask on the surface of the substrate of interest of silicon (100) or of germanium (100).

The growth mask is produced of a material exhibiting a selectivity to etching relative to the material of the substrate.

Typically, the growth mask can be of $SiO_2$ or of SiN.

Generally, the method of the present invention makes it possible to trap the dislocations, close to the growth substrate, and allows the development of layers of III-V material that exhibit very few dislocations and therefore a very good structural quality, that can thereby serve also as a support for producing additional photonic, optoelectronic or even photovoltaic functions.

For this, the method comprises a step of determination of certain parameters, in order to optimize the step of growth of the III-V material, following a prior nucleation operation.

More specifically, the following parameters are best determined first:

the rate of growth $v_{100}$ of the face (100) of said III-V material;

the rate of growth $v_{110}$ of the face (110) of said III-V material.

These rates can, for example, be determined first by growth on oriented substrates (100) and (110).

There is thus a ratio defined: $R = v_{100}/v_{110}$ and with $R>1$, even $R>>1$.

The rates can notably be calculated by:

determining the thickness of material deposited, by ellipsometry or by scanning electron microscopy (TEM) in cross section;

and dividing the determined thickness by the deposition time.

Generally, the angle of the dislocations θ of said III-V material relative to the plane (100) of said substrate, can be, for example, determined by transmission electron microscopy.

The use of this type of method is notably described in the publication by the authors: T. A, C. W. Leitz, M. T. Curie, E. A. Fitzgerald, A. Lochtefeld et al. "High quality Ge on Si by epitaxial necking" Applied Physics Letters, Volume 76, Number 25, 19 Jun. 2000.

Figure 3:
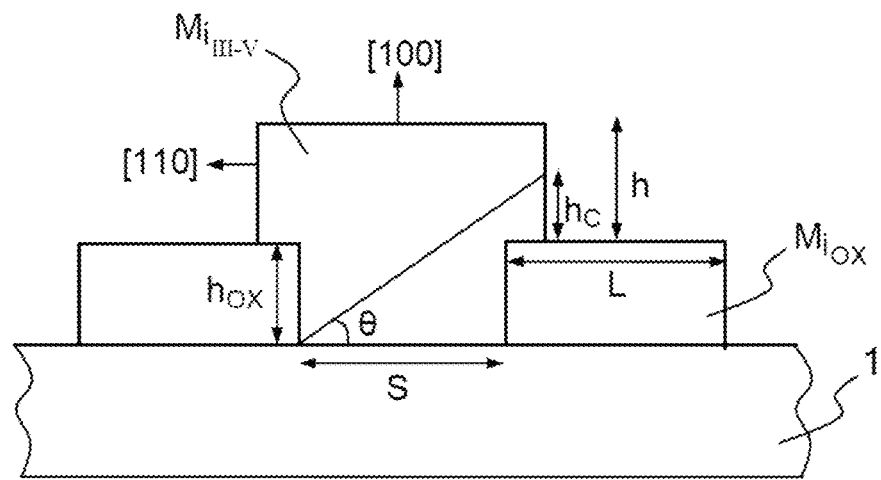
FIG. 3 illustrates the parameters used in the present invention to determine a pattern geometry that is optimal in terms of structural quality of III-V material, on the surface of a substrate (100)

As illustrated in FIG. 3, on a substrate 1, growth masking patterns $Mi_{ox}$ are produced, of width L and of height hox, separated by a distance S on the substrate. It is then possible to produce, after a conventional phase (not represented) of nucleation with a wealth of dislocations (phase that is nevertheless optional depending on the III-V materials concerned) and of small thickness (typically a few tens of nanometres), the selective growth of the III-V material between said patterns $Mi_{ox}$.

It is then possible to determine a critical height of growth of the patterns of III-V material, making it possible to trap the dislocations between the masking patterns. This figure schematically represents the presence of a dislocation in the III-V material, said dislocation forming an angle θ with the substrate (100), in the patterns $Mi_{III\text{-}V}$ of III-V material, thus defined by growth.

The critical minimum height, which should be exceeded to trap the maximum of dislocations, is defined by the following equation:

$$h_c = \frac{h_{ox} - S \times \tan(\theta)}{\frac{\tan(\theta)}{R} - 1} \quad (1)$$

with S: the distance between two adjacent masking patterns and $R > \tan(\theta)$.

On the other hand, seeking to define unitary patterns $Mi_{III-V}$ of III-V material, it is important to observe a minimum distance between said patterns $Mi_{III-V}$ of III-V material so that they cannot coalesce together.

For this, it is advantageously possible also to dictate that the width of the patterns and the height of the patterns in their growth be correlated with the ratio between said rates of growth.

In other words, the second criterion below:

$$L > \frac{2}{R} \times h$$

Typically, growth conditions are dictated such that the unitary patterns remain separated by masking patterns of width L such that a distance of at least a few tens of nanometres is retained.

In the case of a growth of GaAs on silicon (100), the angle θ is equal to 54.7° relative to the plane (100), consequently, if the ratio $h_{ox}/S$ of the cavity is less than tan(54.7°), i.e. approximately 1.41, a few dislocations may then be propagated over the etching pattern and can thus be blocked by the walls of the growth mesa, said mesas corresponding to the patterns $Mi_{III-V}$.

According to the method of the present invention, efforts are made to obtain conditions of growth such that the rate of growth of the face (100) is much greater than that of the face (110), that is to say R>>1, but in any case R>tan(54.7°).

It will thus be possible to determine conditions of growth with which a ratio R equal to approximately 5 is obtained.

The equation (1) shows that, in the present case, $h_c$ is a linear function of S with a slope equal to −tan(54.7°)/[(tan (54.7°)/R)−1] (positive slope because R>tan(54.7°), the abscissa at the origin being $h_{ox}$/[(tan(54.7°)/R)−1]

Figure 4:
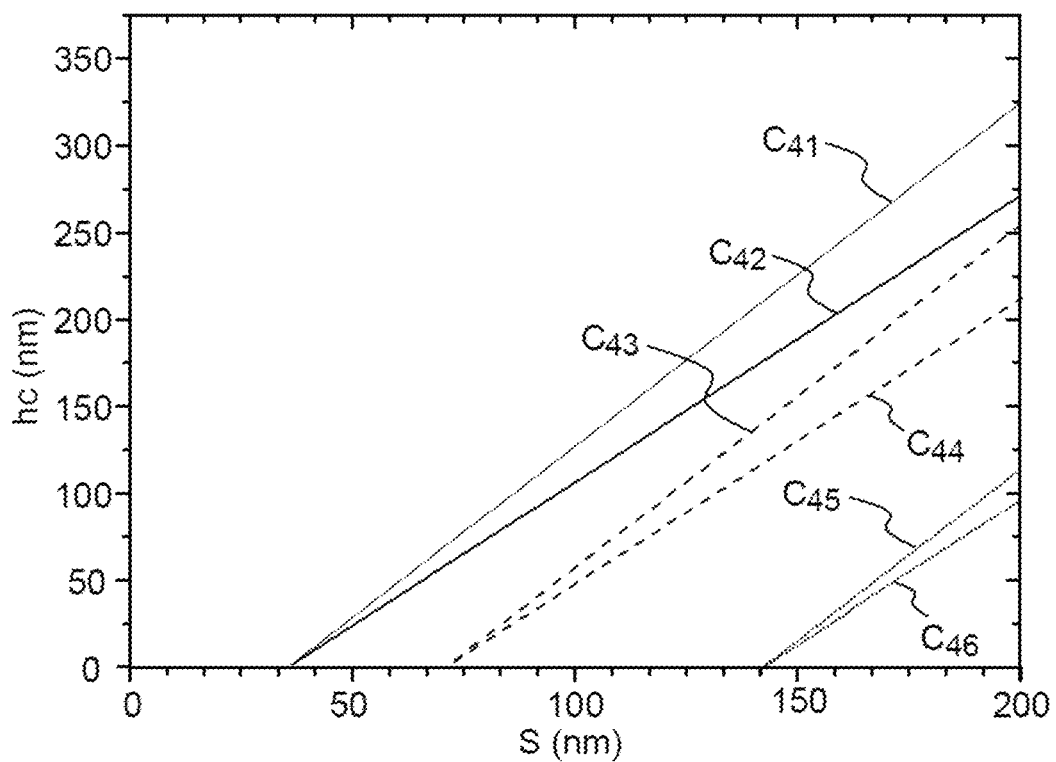
FIG. 4 illustrates different critical growth heights calculated for the method of the present invention as a function of the distance between masking patterns and that make it possible to trap all the emergent dislocations, and do so for different rate ratios $v_{100}/v_{110}$ and for different masking pattern heights.

FIG. 4 shows the minimum thickness $h_c$ as a function of the width of cavity S obtained from the equation (1) for rate ratios R of 5 and 10 and for three cavity heights hox equal to 50 nm or 100 nm or 200 nm. The following curves are thus obtained:

- $C_{41}$ with R=5 and hox=50 nm;
- $C_{42}$ with R=10 and hox=50 nm;
- $C_{43}$ with R=5 and hox=100 nm;
- $C_{44}$ with R=10 and hox=100 nm;
- $C_{45}$ with R=5 and hox=200 nm;
- $C_{46}$ with R=10 and hox=200 nm.

From the determination of this critical thickness, it is thus possible to perform a growth operation that makes it possible to define patterns of height h greater than that critical height and that make it possible in addition to avoid the coalescence of the growth mesas for which the following condition is thus advantageously satisfied, in which L denotes the spacing between cavities:

$$L > \frac{2}{R} \times h \quad (2)$$

Typically, growth conditions are dictated such that the unitary patterns remain separated by a distance of at least a few tens of nanometres.

Figure 5:
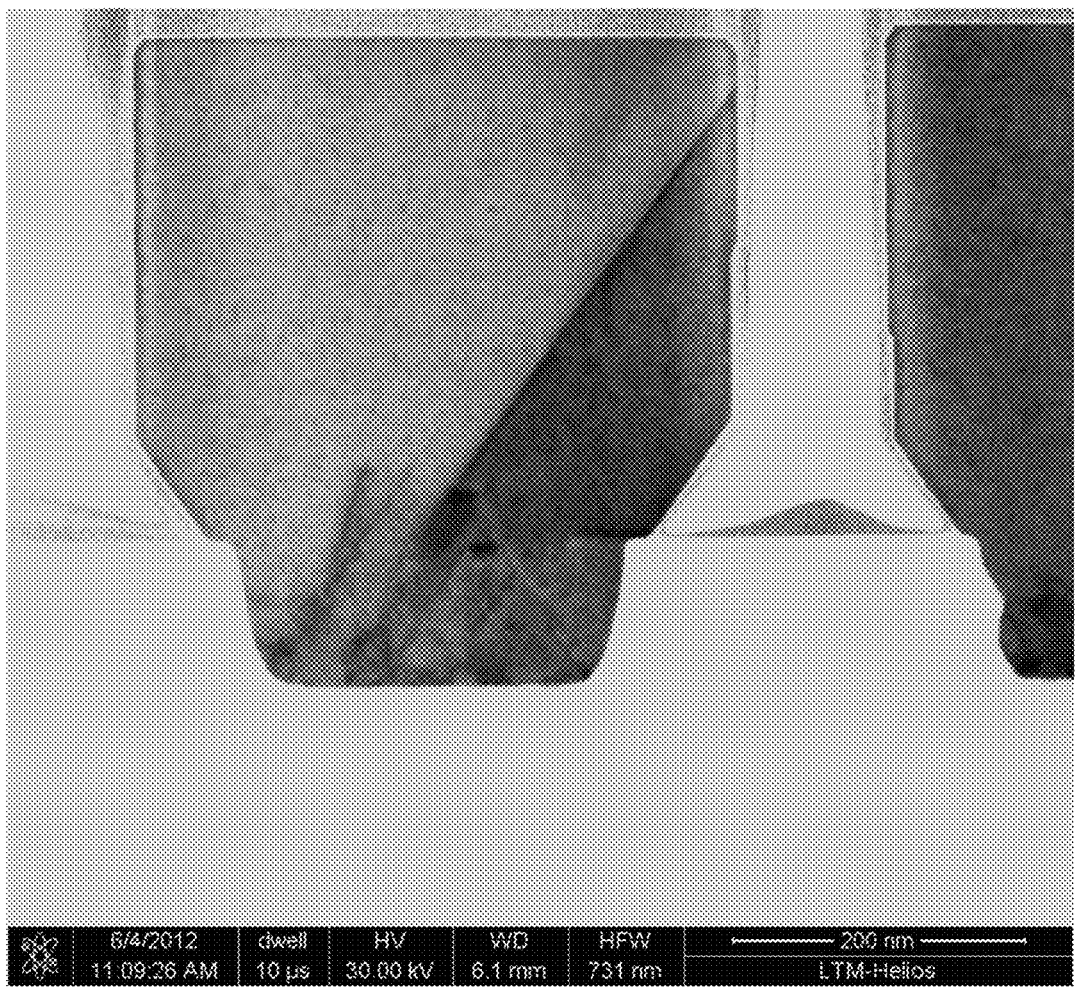
FIG. 5 illustrates an image taken by scanning electron microscopy STEM, of linear patterns $Mi_{III\text{-}V}$, obtained with the method of the invention and taken in transverse cross section in the direction (110) parallel to said linear patterns and illustrating the trapping of an emergent dislocation in said patterns of III-V material.

FIG. 5 illustrates the STEM image taken in cross section in the direction (110) parallel to said linear patterns and illustrating the trapping of an emergent dislocation in the wall of the mesa of III-V material for which R~5, hox~90 nm, S~270 nm, L~240 nm and h~350 nm.

Thus, advantageously, but in a nonlimiting manner, the following conditions make it possible to obtain patterns of III-V material which have not coalesced and whose dislocations are trapped in the masking patterns:

$$R \gg 1.5;$$

$$h > h_c = \frac{h_{ox} - S \times \tan(\theta)}{\frac{\tan(\theta)}{R} - 1}$$

$$L > \frac{2}{R} \times h$$

An example of production of patterns according to the invention is described below after having defined the growth parameters, and the main steps are illustrated using FIGS. 6a to 6e.

Figure 6A:
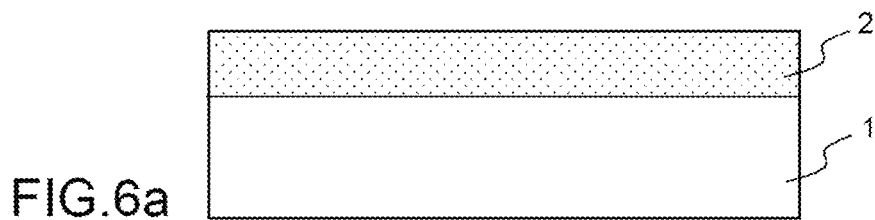
FIGS. 6a to 6e illustrate the different technological steps of an exemplary method according to the invention.

Step 1:

From a silicon substrate (100), an operation of thermal oxidation of said substrate 1 is carried out, making it possible to define a top layer of silicon oxide 2, as illustrated in FIG. 6a.

Figure 6B:
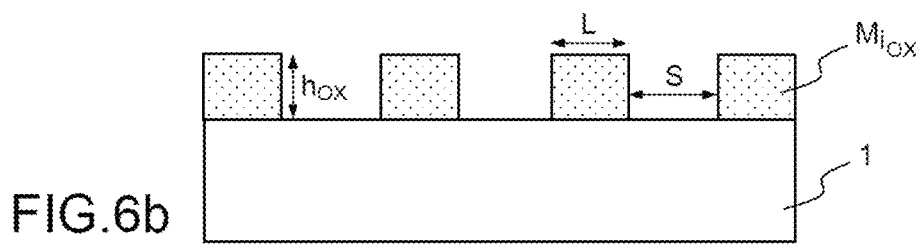

Step 2:

From this layer of oxide, cavities are defined by lithography and etching in the layer of $SiO_2$ to uncover the surface of silicon, as illustrated in FIG. 6b. These cavities have widths of lines S, separated by widths L of masking patterns $Mi_{ox}$ of $SiO_2$, said masking patterns having heights $h_{ox}$.

This surface is then prepared in the conventional way (HF attack for example) to eliminate the $SiO_2$ remaining at the bottom of the hole or to remove the native $SiO_2$.

Step 3:

To produce the growth of III-V materials, for example Ga—As, selectively in the cavities of $SiO_2$, several epitaxial growth operations are carried out.

Figure 6C:
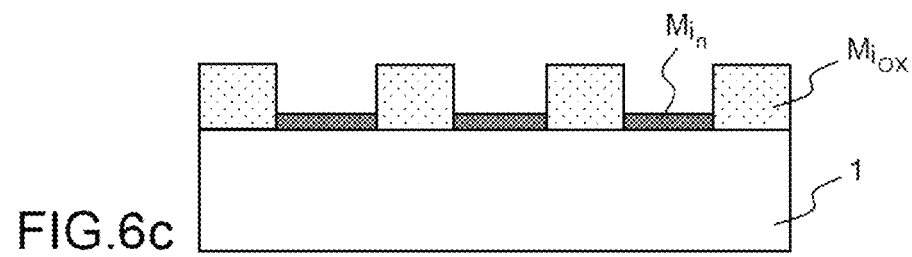

A first nucleation step takes place at low temperature (350° C.-450° C.) which can vary according to the different machines because the temperature measurement is made either by pyrometry or by a thermocouple placed in contact with the rear face of the substrate. The ratio V/III varies conventionally from 1 to 50 depending on the machines and growth methods used that can be molecular beam epitaxy, even more commonly referred to by the acronym MBE, or metal organic vapour phase deposition (MOCVD). A remaining layer is defined in the cavity between the masking patterns of $SiO_2$, as illustrated in FIG. 6c. This nucleation layer containing numerous structural defects makes it possible to define a base of linked patterns $Mi_n$, with strong mesh parameter mismatch, defects which will be blocked by the cavity in the growth of the successive layers, making it possible to define the patterns $Mi_{III-V}$.

Figure 6D:
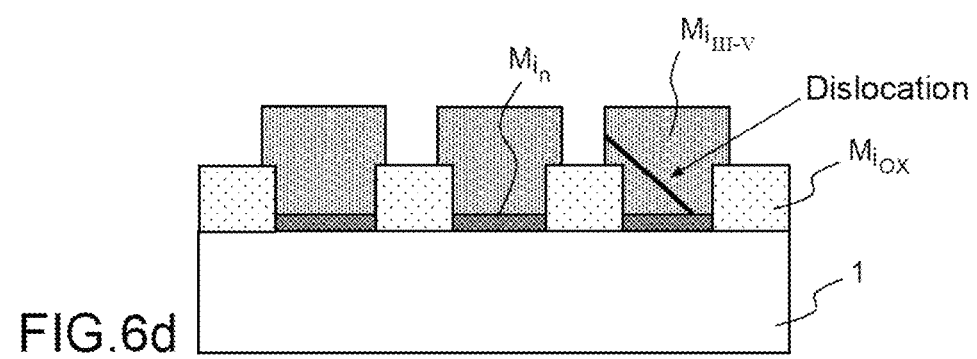
Figure 6E:
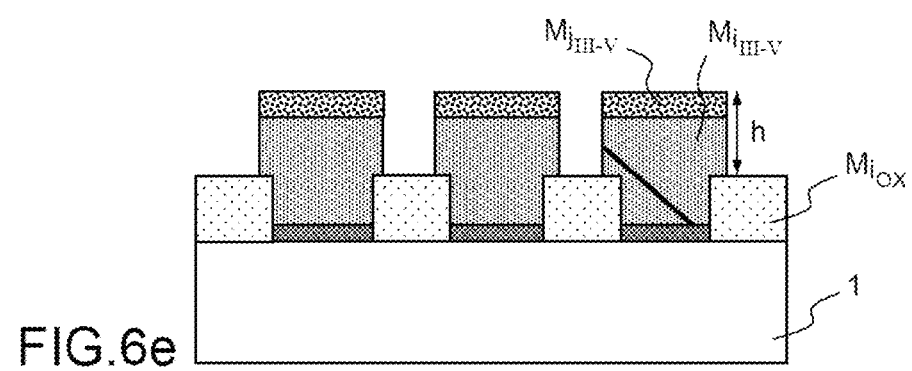

Step 4:

A second layer of III-V material is deposited at higher temperature, typically between 550° C. and 650° C. with a III-V ratio of between 1 and 50. The total pressure is adapted according to the geometry of the reactor, but typical values are between 1 and 100 Torr. This layer leaves the cavity with an oriented top face (100) and oriented lateral faces (110), with stabilized faces (100), as illustrated in FIG. 6d. Since the outer face of the III-V material is of As, (100) As>(110)As is thus imposed on the rates of growth. In effect, it is essential to observe the following condition: V110<V100<V, with V being the rate of growth of all the other directions of existing facets.

Step 5:

The network of linear patterns $Mi_{III-V}$ free of structural defects on the surface can in turn serve as a virtual substrate for the growth of more complex multilayers and therefore of top patterns $Mj_{III-V}$.

The typical dimensions of the cavities are adjusted according to the needs linked to the applications.

As an example, the ratio L/h can be less than or equal to 1 and the parameter S can vary from 20 nm to several hundreds of nanometres.

The invention claimed is:

1. A method for fabricating patterns of III-V semiconductor material on a semiconductor substrate based on oriented silicon or on oriented germanium, comprising the following steps:
    production of a growth mask on the surface of said substrate, defining masking patterns $Mi_{ox}$ of width L, of height $h_{ox}$ with a distance S between masking patterns;
    growth of patterns $Mi_{III-V}$ of III-V material between said masking patterns, such that said patterns exhibit a height h relative to the top plane of said masking patterns, said height h being greater than or equal to a critical minimum height $h_c$, said growth step comprising:
        determining the rate of growth $v_{100}$ in a direction at right angles to the face (100) of said III-V material, and determining the rate of growth $v_{110}$ in a direction at right angles to the face (110) of said III-V material, defining a ratio $R = v_{100}/v_{110}$;
        determining the angle of the dislocations $\theta$ of said III-V material relative to the plane of said substrate;
        determining said critical minimum height $h_c$ defined by the equation:

$$h_c = \frac{h_{ox} - S \times \tan(\theta)}{\frac{\tan(\theta)}{R} - 1}$$

and R being determined to be strictly greater than $\tan(\theta)$.

2. The method for fabricating patterns of III-V semiconductor material on a semiconductor substrate based on oriented silicon or on oriented germanium according to claim 1, further comprising a step of nucleation of III-V material between said masking patterns on the surface of said substrate.

3. The method for fabricating patterns of III-V semiconductor material on a semiconductor substrate based on silicon or on germanium according to claim 1, wherein said height h also satisfies the condition:

$$L > \frac{2}{R} \times h,$$

such that said patterns $Mi_{III-V}$ of III-V material do not coalesce.

4. The method for fabricating patterns of III-V semiconductor material on a semiconductor substrate based on silicon or on germanium according to claim 1, in which that the ratio R is greater than 5.

5. The method for fabricating patterns of III-V semiconductor material on a semiconductor substrate based on silicon or on germanium according to claim 2, in which the steps of nucleation and of growth of the patterns are performed in similar temperature and pressure conditions.

6. The method for fabricating patterns of III-V semiconductor material on a semiconductor substrate based on silicon or on germanium according to claim 2 in which, the nucleation step being performed at a so-called nucleation temperature, the step of growth of the patterns $Mi_{III-V}$ being performed at a so-called growth temperature, said growth temperature is greater than said nucleation temperature.

7. The method for fabricating patterns of III-V semiconductor material on a semiconductor substrate based on silicon or on germanium according to claim 6, in which that said nucleation temperature lies between approximately 300° C. and 450° C., said growth temperature lying between approximately 350° C. and 650° C.

8. The method for fabricating patterns of III-V semiconductor material on a semiconductor substrate based on silicon or on germanium according to claim 1, in which that the masking patterns and the patterns of III-V material are linear patterns.

9. The method for fabricating patterns of III-V semiconductor material on a semiconductor substrate based on silicon or on germanium according to claim 1, comprising the production of top patterns $Mj_{III-V}$ on the surface of said patterns of III-V semiconductor material.

10. The method for fabricating patterns of III-V semiconductor material on a semiconductor substrate based on silicon or on germanium according to claim 1, in which the substrate being of silicon, the III-V material is gallium arsenide.

11. The method for fabricating patterns of III-V semiconductor material on a semiconductor substrate based on silicon or on germanium according to claim 10, in which the angle of the dislocations is 54.7°.

12. The method for fabricating patterns of III-V semiconductor material on a semiconductor substrate based on silicon or on germanium according to claim 1, in which the growth mask is produced by oxidation of said substrate and then etching.

13. The method for fabricating patterns of III-V semiconductor material on a semiconductor substrate based on silicon or on germanium according to claim 1, in which the growth mask is produced by the production of a layer of material exhibiting a selectivity to etching relative to the silicon or to the germanium, followed by an operation of local etching of said layer.

14. The method for fabricating patterns of III-V semiconductor material on a semiconductor substrate based on silicon or on germanium according to claim 13, in which the layer of material exhibiting a selectivity to etching relative to the silicon or to the germanium is made of silicon nitride.

15. The method for fabricating patterns of III-V semiconductor material on a semiconductor substrate based on silicon or on germanium according to claim 1, in which the distance between masking patterns can lie between approximately a few tens of nanometres and a few hundreds of nanometres.

16. The method for fabricating patterns of III-V semiconductor material on a semiconductor substrate based on silicon or on germanium according to claim 1, in which the width of the masking patterns is greater than several tens of nanometres.

17. The method for fabricating patterns of III-V semiconductor material on a semiconductor substrate based on silicon or on germanium according to claim 1, further comprising a step of selective epitaxy of Si or Ge material at the bottom of a cavity produced after the operation of producing the masking patterns and before the operation of growth of the patterns $Mi_{III-V}$.

* * * * *